United States Patent
Liu

(10) Patent No.: US 8,988,147 B2
(45) Date of Patent: Mar. 24, 2015

(54) MULTI-WAY DOHERTY AMPLIFIER

(71) Applicant: Linsheng Liu, Chengdu Sichuan (CN)

(72) Inventor: Linsheng Liu, Chengdu Sichuan (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 68 days.

(21) Appl. No.: 13/721,367

(22) Filed: Dec. 20, 2012

(65) Prior Publication Data

US 2013/0181773 A1 Jul. 18, 2013

(30) Foreign Application Priority Data

Dec. 26, 2011 (CN) .......................... 2011 1 0441789

(51) Int. Cl.
*H03F 3/68* (2006.01)
*H03F 1/02* (2006.01)
*H03F 3/60* (2006.01)

(52) U.S. Cl.
CPC ................ *H03F 3/68* (2013.01); *H03F 1/0288* (2013.01); *H03F 3/602* (2013.01); *H03F 2200/198* (2013.01)
USPC ..................................... 330/124 R; 330/295

(58) Field of Classification Search
USPC .................... 330/295, 124 R, 84, 286, 53–54
See application file for complete search history.

(56) References Cited

U.S. PATENT DOCUMENTS

| 6,853,245 B2 | 2/2005 | Kim et al. |
| 7,164,316 B2 | 1/2007 | Kim et al. |
| 8,022,760 B2 * | 9/2011 | Gajadharsing et al. ... 330/124 R |
| 8,324,965 B2 | 12/2012 | Meng |

FOREIGN PATENT DOCUMENTS

| CN | 101534093 A | 9/2009 |
| WO | 2009081341 A1 | 7/2009 |

OTHER PUBLICATIONS

Kim, J. et al., "Optimum Operation of Asymmetrical-Cells-Based Linear Doherty Power Amplifiers—Uneven Power Drive and Power Matching", IEEE Transactions on Microwave Theory and Techniques, May 1, 2005, pp. 1802-1809, vol. 53, No. 5, IEEE.

Jung, J., et al., "A New "Series-Type" Doherty Amplifier for Miniaturization", 2005 IEEE Radio Frequency integrated Circuits (RFIC) Symposium, Digest of Papers, Jul. 12, 2005, pp. 259-262, IEEE.

(Continued)

*Primary Examiner* — Hieu Nguyen

(74) *Attorney, Agent, or Firm* — Coats & Bennett, PLLC

(57) ABSTRACT

The present disclosure provides a multi-way Doherty amplifier that includes an amplifier input, an amplifier output, a main amplifier having an input connected to the amplifier input, and at least a first and a second peak amplifier. In the Doherty amplifier, an input of the first peak amplifier is connected to the amplifier input or an output of the main amplifier, and an input of the second peak amplifier is connected to the amplifier input, the output of the main amplifier or an output of the first peak amplifier. The Doherty amplifier further comprises a first impedance converter connected between the output of the main amplifier and the amplifier output, a second impedance converter connected between the output of the first peak amplifier and an output of the second peak amplifier, and a third impedance converter connected between the output of the second peak amplifier and the amplifier output.

8 Claims, 14 Drawing Sheets

(56) References Cited

OTHER PUBLICATIONS

Koo, C. et al., "A Linearity-Enhanced Compact Series-Type Doherty Amplifier Suitable for CDMA Handset Applications", Conference publication, 2007 IEEE Radio and Wireless Symposium, Jan. 9, 2007, pp. 317-320, IEEE.

Kim, B. et al., "Advanced Doherty Architecture", IEEE Microwave Magazine, Aug. 1, 2010, pp. 72-86, vol. 11, Issue 5, IEEE.

Srirattana, N. et al., "Analysis and Design of a High-Efficiency Multistage Doherty Power Amplifier for Wireless Communications", IEEE Transactions on Microwave Theory and Techniques, Mar. 1, 2005, pp. 852-860, vol. 53, Issue 3, IEEE.

Kang, D. et al., "Design of Doherty Power Amplifiers for Handset Applications", IEEE Transactions on Microwave Theory and Techniques, Aug. 1, 2010, pp. 2134-2142, vol. 58, Issue 8, IEEE.

Nick, M. et al., "Adaptive Input-Power Distribution in Doherty Power Amplifiers for Linearity and Efficiency Enhancement", IEEE Transactions on Microwave Theory and Techniques, Nov. 1, 2010, pp. 2764-2771, vol. 58, Issue 11, IEEE.

Kim, I. et al., "Optimized Design of a Highly Efficient Three-Stage Doherty PA Using Gate Adaptation", IEEE Transactions on Microwave Theory and Techniques, Oct. 1, 2010, pp. 2562-2574, vol. 58, Issue 10, IEEE.

Angelov, I. et al., "Extensions of the Chalmers Nonlinear HEMT and MESFET Model", IEEE Transactions on Microwave Theory and Techniques, Oct. 1, 1996, pp. 1664-1674, vol. 44, Issue 10, IEEE.

Yang, Y. et al., "A Microwave Doherty Amplifier Employing Envelope Tracking Technique for High Efficiency and Linearity", IEEE Microwave and Wireless Components Letters, Sep. 1, 2003, pp. 370-372, vol. 13, Issue 9, IEEE.

Fager, C. et al., "Prediction of IMD in LDMOS Transistor Amplifiers Using a New Large-Signal Model", IEEE Transactions on Microwave Theory and Techniques, Dec. 1, 2002, pp. 2834-2842, vol. 50, Issue 12, IEEE.

Kang, D. et al., "Broadband HBT Doherty Power Amplifiers for Handset Applications", IEEE Transactions on Microwave Theory and Techniques, Dec. 1, 2010, pp. 4031-4039, vol. 58, Issue 12, IEEE.

Liu, L-S. et al., "Electrothermal Large-Signal Model of III-V FETs Including Frequency Dispersion and Charge Conservation", IEEE Transactions on Microwave Theory and Techniques, Dec. 1, 2009, pp. 3106-3117, vol. 57, Issue 12, IEEE.

Doherty, W., "A new high efficiency power amplifier for modulated waves", Proceedings of the Institute of Radio Engineers, Sep. 1, 1936, pp. 1163-1182, vol. 24, Issue 9, IEEE.

* cited by examiner

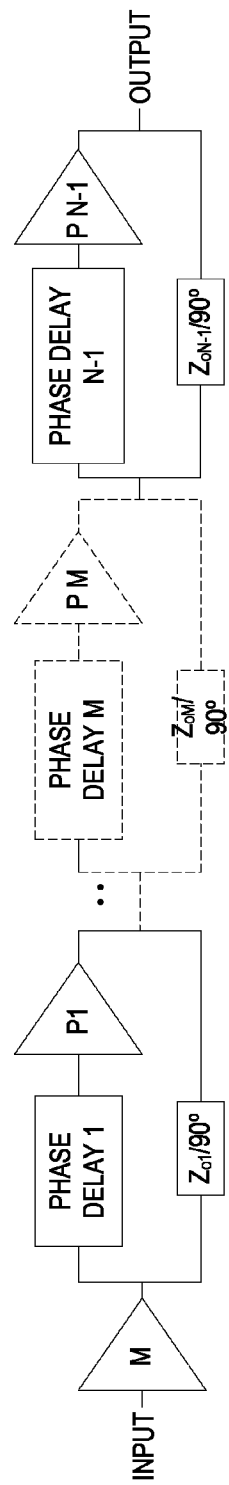
FIG. 9
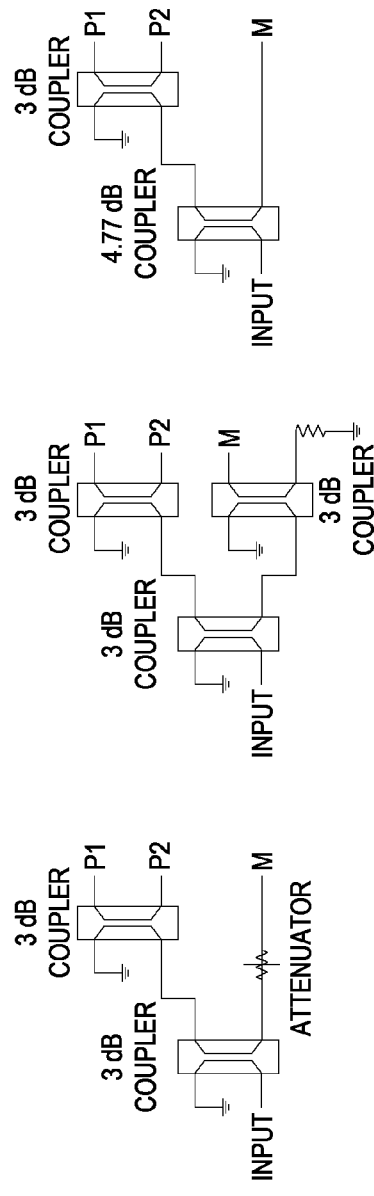
FIG. 10A
FIG. 10B
FIG. 10C

US 8,988,147 B2

MULTI-WAY DOHERTY AMPLIFIER

TECHNICAL FIELD

The present disclosure relates to design of power amplifiers, and more particularly, to a multi-way Doherty amplifier.

BACKGROUND

In modern wireless communication systems such as Wideband Code Division Multiple Access (WCDMA) and Orthogonal Frequency Division Multiplex (OFDM) systems, there is a need for high-efficiency power amplifiers to accommodate the 3rd generation (3G) and the 4th generation (4G) of communication standards. These new standards provide more and advanced data services within a restricted frequency band and make use of signals with high Peak-to-Average Power Ratio (PAPR). As a result, base station amplifiers for these signals will operate, in most of time, at much lower power levels than the peak powers they are designed for. Consequently, traditional class-AB amplifiers are less attractive candidates for these signals since their efficiencies are seriously degraded when operating below their peak powers. To avoid this efficiency degradation, various amplifier structures with improved efficiency have been proposed.

The Doherty Power Amplifier (DPA) structure proposed by W. H. Doherty [1] in 1936 is a well-known technique providing potential for improved transmitter efficiency, especially for signal protocols with high PAPR (typically from 6 to 12 dB). Although the DPA has significant efficiency advantages, in general, it needs to be augmented with some form of correction or linearity enhancement (such as Digital Pre-Distortion) in a full transmitter design.

The attractiveness of the DPA configuration consists in that it involves familiar amplifier designs with a simple structure that maintains considerably high efficiency over an extended input signal range. The DPA structure has been energized by the latest transistor techniques and is well described in literatures. The DPA can be configured with 2-way, 3-way or multi-way combinations for high PAPR signals.

As shown in FIG. 1, the original DPA structure includes two amplifiers. In general, a DPA has a structure in which a carrier (main) amplifier (M) and a peak amplifier (P) have their outputs connected in parallel by using a quarter-wave impedance transformer ($\lambda/4$ transmission line). Further, the DPA is driven by a method as follows. The peak amplifier modulates a load impedance of the main amplifier by increasing the amount of current supplied to the load from the peak amplifier as the power level increases, thereby improving the efficiency of the DPA. The DPA structure shown in FIG. 1 further includes an input power splitter for distributing the input power to the main amplifier and the peak amplifier in a fixed ratio. As the input power splitter, for example, a passive branch-line hybrid, a ring hybrid, a Wilkinson power splitter or the like can be used. The input power splitter can be either a quadrature splitter or an in-phase splitter.

FIG. 2 shows a compact "series-type" DPA developed for mobile handset devices [2], [3], in which the bulky and lossy input power splitter/coupler is eliminated. Unlike the classical "parallel" connected DPA, in the DPA structure shown in FIG. 2, the main and peak amplifiers (M and P) are arranged in series, with the impedance inverting network ($\lambda/4$ transmission line) connecting the outputs of the main and peak amplifiers. The input power splitter is replaced with a simple phase delay and an input impedance matching circuit between the peak and main amplifiers. In this way, the need for an input power coupler is also eliminated, which facilitates integration (such as Monolithic Microwave Integrated Circuit (MMIC)) [4] and miniaturization.

Moreover, the series-type DPA enables a direct input power dividing technique [5]-[7] for enhanced efficiency and linearity. In practice, in the classical DPA, the low gain of the peak amplifier prevents the implementation of a proper load modulation. Therefore, neither of the main and peak amplifiers can generate its respective output power, leading to performance degradation. In order to overcome this problem, Kim et al. [8] used an uneven power divider at the input to the DPA to enhance the output power of the peak amplifier for a better load modulation, at the cost of lower gain and efficiency at back-off power levels. Another commonly used approach involves adaptive bias control [9], which, however, requires extra complicated circuits and thus increases sizes and costs.

The aforementioned problems can be alleviated through a power-dependent input power distribution to efficiently drive the main and peak amplifiers. This approach relies on the nonlinear behavior of the input impedance of the peak amplifier [6]. In essence, similar to output current of a transistor, the input capacitance of the peak amplifier is also a function of the input driving level (bias points). Consequently, the peak amplifier's input nonlinearities from the pinch-off region to the saturation region can be utilized for the so-called "source modulation", which in turn improves the load modulation of the main and peak amplifiers at their outputs.

In the DPA, the main amplifier is biased in Class B or AB, and the peak amplifier is biased in Class C. Accordingly, only the main amplifier is operating at a low power level. As the power level increases, the efficiency of the main amplifier increases and reaches the first maximum efficiency point. At this power level, the peak amplifier is turned on. The second maximum efficiency point is reached when the peak amplifier provides a high efficiency. Therefore, the DPA has two maximum efficiency points, which improves the efficiency at the back-off output power level.

In the classical symmetrical DPA configuration, the saturation power of the main amplifier is $\frac{1}{4}$ of the maximum system output power. This results in an efficiency peak at 6-dB output power back-off from the normal peak efficiency power level. Therefore, compared to the main power amplifier, the size (asymmetrical devices) and numbers (multiple peak amplifiers, see FIGS. 3 and 4) of the peak power amplifier(s) determine the DPA's back-off output power level at the first maximum efficiency point. Accordingly, an improved average efficiency can be expected for amplification of modulated signals with high PAPR (>6 dB).

FIG. 3 shows an existing 3-way DPA structure (Type I) [12], in which two peak amplifiers operate in the same state. In the 3-way DPA shown in FIG. 3, an input power splitter is used at the DPA input. The output of the main amplifier (M) is connected to the DPA output via a $\lambda/4$ transmission line. The outputs of the peak amplifier 1 (P1) and the peak amplifier 2 (P2) are connected to the DPA output. FIG. 4 shows an arrangement in which the DPA structure of FIG. 3 is extended to N-way (with N−1 peak amplifiers operating in the same state).

FIGS. 5 and 7 show other two types of 3-way DPA structures [10]. These two types of 3-way DPAs have three maximum efficiency points in the back-off region and have two peak amplifiers operating at different states to improve the DPA efficiency. FIG. 6 shows an arrangement in which the DPA structure of FIG. 5 is extended to N-way. The DPA structure in FIG. 5 (Type II) can be considered as a parallel combination of one DPA (composed of the main amplifier (M) and the peak amplifier 1 (P1) as shown in FIG. 5) used as a main amplifier and another peak amplifier (the peak amplifier 2 (P2) as shown in FIG. 5). The peak amplifier 1 (P1) modulates the load of the main amplifier (M) initially and the peak amplifier 2 (P2) modulates the load of the previous Doherty stage at a higher power. The DPA structure in FIG. 7 (Type III) can be considered as a parallel combination of one DPA (composed of the peak amplifier 1 (P1) and the peak amplifier 2 (P2) as shown in FIG. 7) used as a peak amplifier and a main amplifier (the main amplifier (M) as shown in FIG. 7). Both structures use three power amplifier units, but the two peak amplifiers, P1 and P2, are turned on sequentially instead of simultaneously as in Type I DPA (FIG. 3). Thus, three peak efficiency points are formed, i.e., two turn-on points and a peak power point.

However, the Type II 3-way DPA cannot provide sufficient load modulation for the main amplifier. Accordingly, the gain at the low output power region where only the main amplifier is operating is lower than that of the DPA at the peak output power. Such gain fluctuation, which indicates a nonlinear AM-AM characteristic, is a serious problem of the Type II DPA. However, the Type III DPA can be designed using identical power amplifiers having the same peak envelope power. The load impedance of the main amplifier can be modulated over the full dynamic range. Thus, the Type III DPA theoretically provides a uniform gain across all input power levels. Besides, for the Type II 3-way DPA, a saturated operation of the main amplifier with constant current is required for proper output power combining. This highly saturated condition may destroy the device operation. This is another problem of the Type II DPA. In contrast, the Type III DPA does not have these problems and is thus preferred.

The series-type DPA can be extended to 3-way and N-way as well [3], as shown in FIGS. 8 and 9, respectively. The DPA circuits shown in FIGS. 8 and 9 can be considered as the electrical equivalents, in series-type arrangement, to the 3-way (FIG. 5) and N-way (FIG. 6) Type II DPAs.

In a case where PAPR>6 dB, the 3-way or N-way DPA configuration is preferred for a higher average efficiency. The disadvantages of the existing solutions for the parallel-connected 3-way DPAs are as follows:

Type I DPA:
  Only two peak efficiency points (similar to the 2-way asymmetrical DPA, i.e., the main amplifier and the peak amplifier having different sizes);
  Incapable of maintaining high efficiency in the intermediate output power level;
  Need for an input power splitter.
Type II DPA:
  Non-uniform power gain;
  Insufficient load modulation for the main amplifier;
  Highly saturated operation of the main amplifier with constant current;
  Need for input power splitter.
Type III DPA:
  Need for input power splitter.

It can be seen from above that the existing solutions for the parallel-type DPA need a power splitter/divider in the input circuit, which increases the circuit size and loss. Taking a 3-way DPA as an example, FIG. 10 shows several circuit design examples in which an input power coupler distributes an input signal to a main amplifier and two peak amplifiers based on a power distribution ratio of 1:1:1. For an N-way DPA, more complicated power coupler circuits are required.

On the contrary, the existing solutions for the 3-way and N-way (as shown in FIGS. 8 and 9) series-type DPA do not need the bulky input power splitter, resulting in an enhanced linearity and a higher integration. However, while the highly saturated operation of the main amplifier can be avoided in the 3-way series-type DPA, it still has similar problems as in the parallel-connected Type II DPA, such as non-uniform power gain, insufficient load modulation for the main amplifier, etc.

SUMMARY

It is thus an object of the present disclosure to solve at least some of the above problems in the prior art by providing an improved multi-way (3-way or N-way) Doherty amplifier.

According to an aspect of the present disclosure, a multi-way Doherty amplifier is provided, which includes: an amplifier input; an amplifier output; a main amplifier having an input connected to the amplifier input; at least a first peak amplifier and a second peak amplifier, wherein an input of the first peak amplifier is connected to the amplifier input or an output of the main amplifier, and an input of the second peak amplifier is connected to the amplifier input, the output of the main amplifier or an output of the first peak amplifier; a first impedance converter connected between the output of the main amplifier and the amplifier output; a second impedance converter connected between the output of the first peak amplifier and an output of the second peak amplifier; and a third impedance converter connected between the output of the second peak amplifier and the amplifier output.

According to another aspect of the present disclosure, a multi-way Doherty amplifier is provided, which includes: an amplifier input; an amplifier output; a main amplifier having an input connected to the amplifier input; 1st to N-th peak amplifiers where N is an integer larger than 2, wherein an input of the 1st peak amplifier is connected to the amplifier input or an output of the main amplifier, for an integer $2 \leq n \leq N$, an input of the n-th peak amplifier is connected to the amplifier input, the output of the main amplifier or an output of one of the 1st to the (n−1)-th peak amplifiers; and 1st to (2N−1)-th impedance converters, wherein the 1st impedance converter is connected between the output of the main amplifier and the amplifier output, the 2nd impedance converter has one end connected to the output of the 1st peak amplifier and the other end connected to one end of the 3rd impedance converter, the other end of the 3rd impedance converter is connected to the amplifier output; for interger $2 \leq m \leq N-1$, one end of the 2m-th impedance converter is connected to an output of the m-th peak amplifier, the other end of the 2m-th impedance converter is connected to one end of the (2m+1)-th impedance converter, and the other end of the (2m+1)-th impedance converter is connected to a point at which the (2m−2)-th impedance converter is connected to the (2m−1)-th impedance converter; and wherein an output of the N-th peak amplifier is connected to a point at which the (2N−2)-th impedance converter is connected to the (2N−1)-th impedance converter.

There is also provided an apparatus which includes the multi-way Doherty amplifier according to the above solutions. The apparatus can be a base station or a user equipment.

The multi-way Doherty amplifier according to the embodiments of the present disclosure has the advantages of the above parallel-connected Type III and series-connected Type II DPAs. With the above structures for connecting the main amplifier and the peak amplifiers, there is no need for the input power splitter, leading to a smaller circuit size and a lower cost, which is particularly suitable for applications with low power consumptions and high integrations (e.g., handset power amplifiers). In addition, the load impedance of the main amplifier can be modulated over the full dynamic range, so as to achieve a uniform power gain. Further, the multi-way Doherty amplifier according to the embodiments of the present disclosure can have improved repeatability and stability since it can be designed using identical devices having the same peak envelope power. Meanwhile, it is possible to provide a proper power-dependent power distribution ratio by using an adaptive input power distribution technique to improve the load modulation for the main amplifier and the peaking amplifiers, thereby achieving enhanced efficiency and linearity. Similar to the nonlinear output current of the amplifier used for load modulation, the nonlinearity of the input impedances of the peak amplifiers is utilized for "source modulation".

BRIEF DESCRIPTION OF THE DRAWINGS

The above and other objects, features and advantages will be more apparent from the following description of embodiments with reference to the figures, in which:

FIG. 9 is a schematic diagram of a N-way series-type DPA according to a prior art;

FIGS. 10A-C are schematic diagrams of input power coupler circuits used in a 3-way DPA;

DETAILED DESCRIPTION OF PREFERRED EMBODIMENTS

The embodiments of the present disclosure will be detailed below with reference to the drawings. In the following description, details and functions unnecessary for the present disclosure will be omitted, so as not to obscure the concept of the present disclosure.

Figure 1:
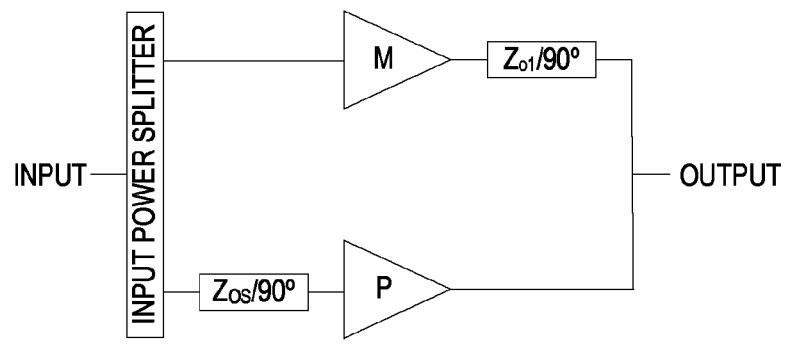
FIG. 1 is a schematic diagram of a classic 2-way parallel-type DPA.
Figure 2:
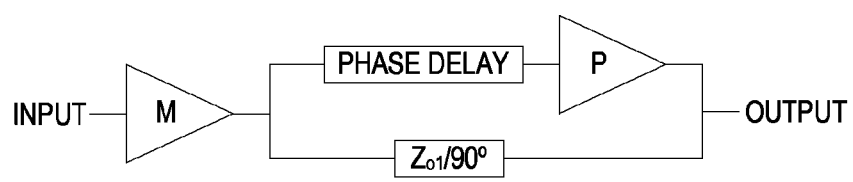
FIG. 2 is a schematic diagram of a conventional 2-way series-type DPA.
Figure 3:
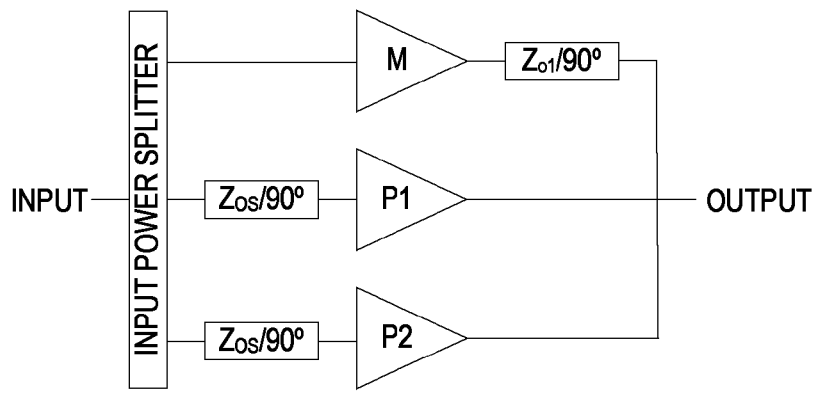
FIG. 3 is a schematic diagram of a 3-way Type I DPA according to a prior art.
Figure 4:
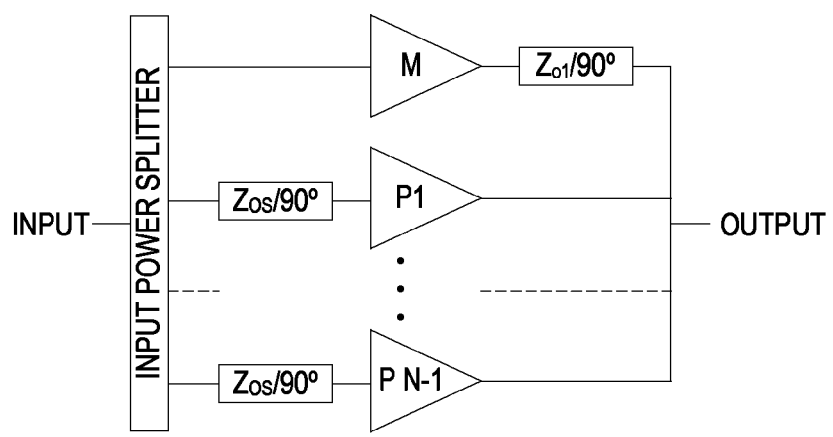
FIG. 4 is a schematic diagram of a N-way Type I DPA according to a prior art.
Figure 5:
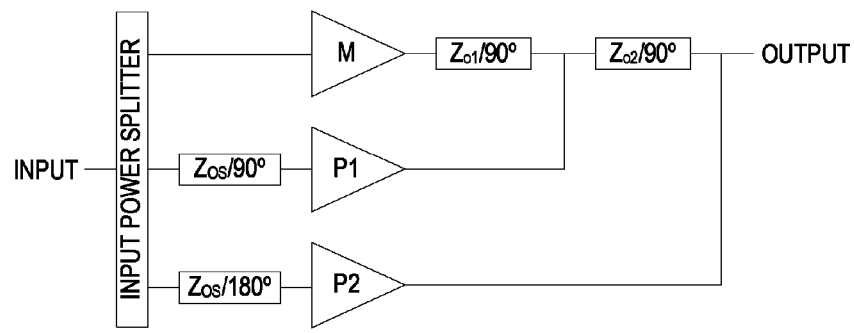
FIG. 5 is a schematic diagram of a 3-way Type II DPA according to a prior art.
Figure 6:
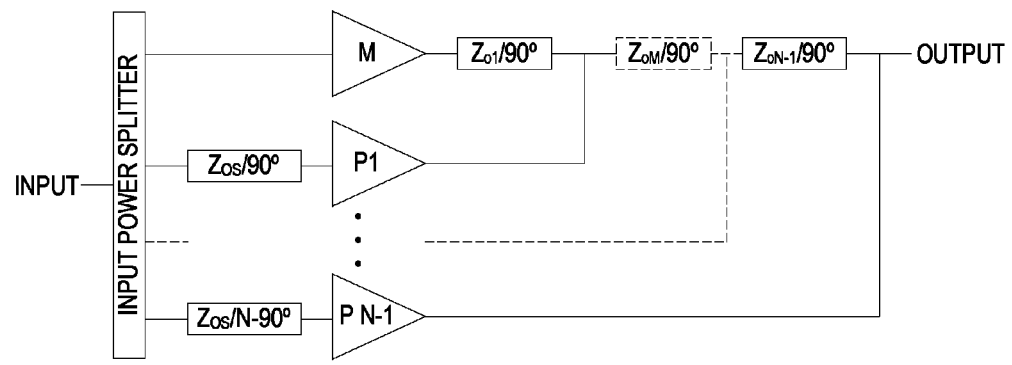
FIG. 6 is a schematic diagram of a N-way Type II DPA according to a prior art.
Figure 7:
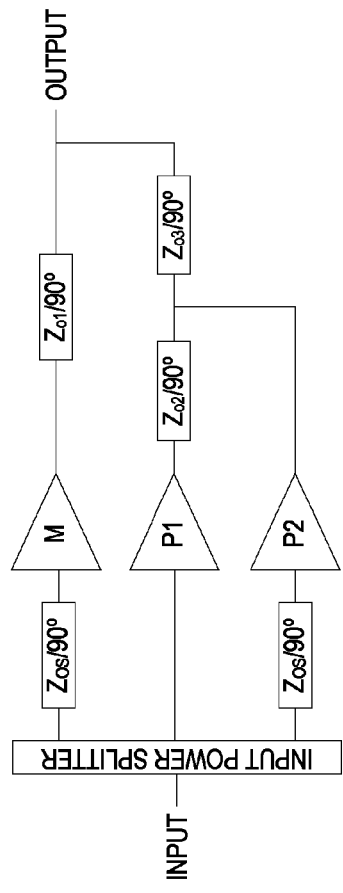
FIG. 7 is a schematic diagram of a 3-way Type IIII DPA according to a prior art.
Figure 8:
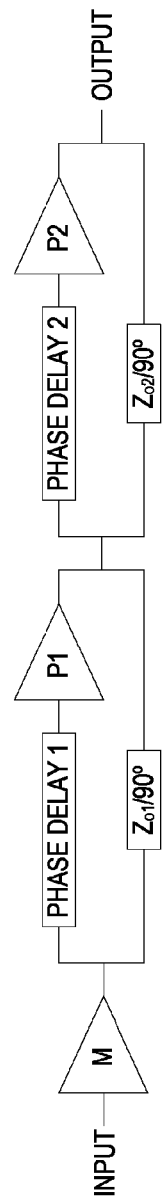
FIG. 8 is a schematic diagram of a 3-way series-type DPA according to a prior art.
Figure 11A:
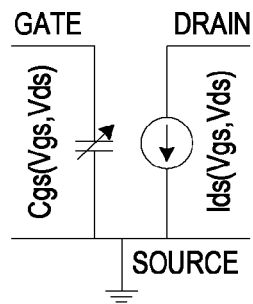
FIGS. 11A and 11B are schematic diagrams showing a simplified equivalent circuit of a non-linear Field Effect Transistor (FET) and its non-linear input capacitance (Cgs) and output current (Ids) characteristics, respectively.

First of all, non-linear characteristics in a power transistor will be discussed with reference to FIGS. 11A and 11B. The simplified large-signal power transistor equivalent circuit in FIG. 11A shows the major nonlinearities of the amplifier. Taking a Field Effect Transistor (FET) such as LDMOSFET and GaN HEMT for example, its major intrinsic nonlinearities come from bias-dependent I-V (current-voltage) and Q-V (quantity-voltage) relationships [14]. Simple empirical hyperbolic tangent expressions (Angelov model [15], Fager-Statz model [16]) can be used to represent the non-linear input capacitance (Cgs) and output current (Ids) characteristics.

Figure 11B:
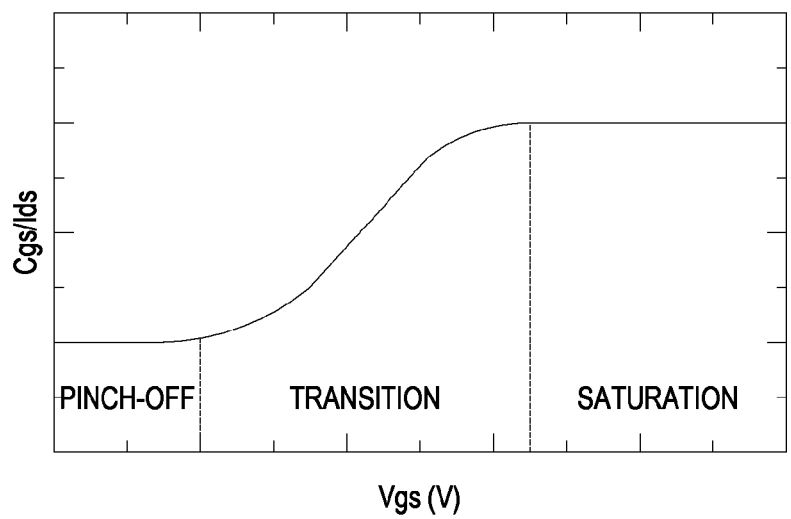

FIG. 11B shows the nonlinear input capacitance (Cgs) and output current (Ids) characteristics of a transistor/amplifier. It can be seen that the input and output of the amplifier have similar characteristics from the pinch-off region to the saturation region, i.e., both increase, with the increase of the input signal level (amplitude), from the minimum values in the pinch-off region, across the transition region, to the maximum values in the saturation region. Corresponding to the impedance converter ($\lambda/4$ transmission line), the non-linear output current, Ids, has been fully utilized for the DPA output power, while the peak amplifier is initially biased at pinch-off (Class-C). Similarly, the non-linear input capacitance, Cgs, which varies with the variation of the input signal power, can be also controlled for adaptive direct power dividing, without the need for any additional power couplers [3]-[7].

Figure 12:
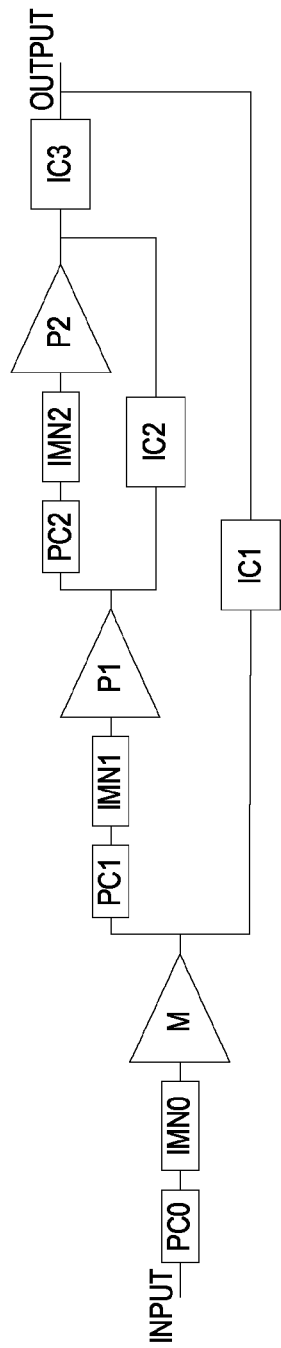
FIG. 12 is a schematic diagram of a 3-way DPA according to an embodiment of the present disclosure.

FIG. 12 is a schematic diagram of a 3-way DPA according to an embodiment of the present disclosure. The DPA shown in FIG. 12 may include: an amplifier input; an amplifier output; a main amplifier (M) having an input connected to the amplifier input; a first peak amplifier (P1) and a second peak amplifier (P2), wherein an input of the first peak amplifier is connected to an output of the main amplifier, and an input of the second peak amplifier is connected to an output of the first peak amplifier; a first impedance converter IC1 connected between the output of the main amplifier and the amplifier output; a second impedance converter IC2 connected between the output of the first peak amplifier and an output of the second peak amplifier; and a third impedance converter IC3 connected between the output of the second peak amplifier and the amplifier output. In an embodiment, each of the first, second and third impedance converters is a transmission line of an odd multiple of ¼ wavelength ($\lambda/4$) and has a phase shift of an odd multiple of 90°. It can be appreciated by those skilled in the art that above specific implementations of the first, second and third impedance converters as well as the specific values of their phase shift are exemplary only. Other implementations are also possible as long as these impedance converters can satisfy the impedance conversion requirements in the DPA.

The 3-way DPA shown in FIG. 12 may further include: a first impedance matcher IMN0 via which the input of the main amplifier is connected to the amplifier input; a second impedance matcher IMN1 via which the input of the first peak amplifier is connected to the amplifier input or the output of the main amplifier; and a third impedance matcher IMN2 via which the input of the second peak amplifier is connected to the amplifier input, the output of the main amplifier or the output of the first peak amplifier. It can be appreciated by those skilled in the art that the implementation of the 3-way DPA according to the present disclosure is not limited to the above specific configuration of the impedance matchers. Other configurations are also possible as long as the non-linear input impedance of an amplifier can match from the input of the transistor to the output of its previous amplifier stage to obtain a suitable converted impedance value, such that a portion of the output power of the previous amplifier stage is coupled, as the signal level (amplitude) changes, to drive the subsequent amplifier stage to operate properly. In particular, as the first stage of the DPA, the main amplifier has its input impedance matcher IMN0 for matching the impedance value of a signal source input.

In an embodiment, the impedances of the first, second and third impedance matchers can be designed based on non-linear characteristics of the main amplifier, the first peak amplifier and the second peak amplifier. For different non-linear input impedances of an amplifier and output characteristics of its previous amplifier stage, different impedance matcher designs are required to obtain the converted non-linear impedance values corresponding to different signal powers and capable of achieving optimal DPA performances at the output of the previous amplifier stage with adaptive power distribution.

The 3-way DPA shown in FIG. 12 may further include: a first phase compensator PC0 via which the input of the main amplifier is connected to the amplifier input; a second phase compensator PC1 via which the input of the first peak amplifier is connected to the amplifier input or the output of the main amplifier; and a third phase compensator PC2 via which the input of the second peak amplifier is connected to the amplifier input, the output of the main amplifier or the output of the first peak amplifier, wherein phase shifts of the first, second and third phase compensators are designed to compensate phase shifts of the first, second and third impedance converters such that a signal input from the amplifier input has the same phase at the amplifier output after passing through any of branches in the multi-way Doherty amplifier. Herein, due to the combined effect of the designed input impedance matchers and the phase compensators for the peak amplifiers, the non-linear impedance of a peak transistor (amplifier) can be converted from the transistor input to the output plane of its previous amplifier stage, so as to obtain a desired non-linear match impedance value. In this way, a small fraction of the output power of the previous amplifier stage is coupled to the input of the peak amplifier within a suitable back-off power range of the DPA, such that the peak amplifier can be turned on to operate properly. Therefore, the output impedance modulation characteristics of the DPA can be achieved to improve the DPA efficiency.

In the following, specific implementations of the embodiment of FIG. 12 and other alternatives of 3-way DPAs will be described with reference to FIGS. 13-17. It can be appreciated by those skilled in the art that the specific values, e.g., phase shifts of impedance converters, impedance matcher and phase compensators, are illustrative only and can be modified without departing from the scope of the present disclosure.

Figure 13:
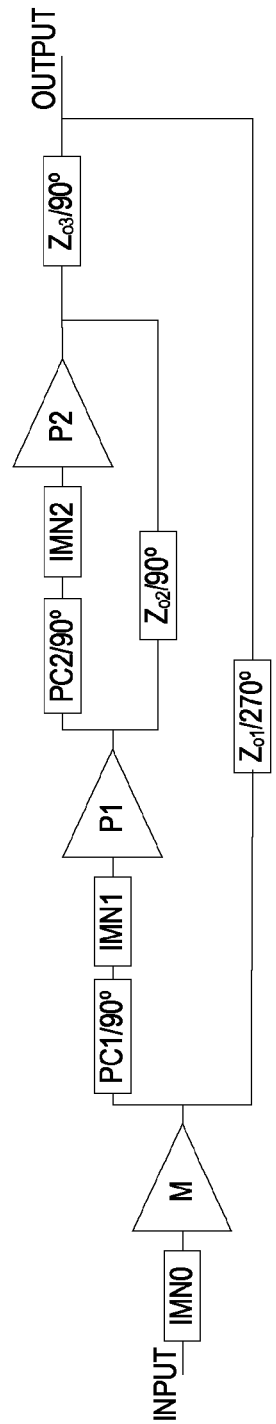
FIGS. 13-17 show exemplary implementations of 3-way DPAs according to embodiments of the present disclosure.

For a radio base station (RBS) application, a quarter-wave (90°) transmission line is typically used as an impedance converter. FIG. 13 shows a specific implementation of the DPA structure of FIG. 12. For example, as shown in FIG. 13, the first impedance converter $Z_{o1}$ has a phase shift of 270°, and each of the second impedance converter $Z_{o2}$ and the third impedance converter $Z_{o3}$ has a phase shift of 90°. Additionally, the first phase compensator PC0 is not shown (i.e., having a phase shift of 0°), and each of the second phase compensator PC1 and the third phase compensator PC2 has a phase shift of 90°. A signal input from the amplifier input has the same phase (270°) at the amplifier output after passing through any of branches in the 3-way DPA. The peak impedance matchers IMN1, IMN2 and the phase compensators PC1, PC2 are configured such that the non-linear input impedance of each peak amplifier is converted from the input of the amplifier to the output of its previous amplifier stage to enable the adaptive direct power dividing, so as to drive the Class-C biased peak amplifier for power combination with the main amplifier at the output of the DPA.

Figure 14:
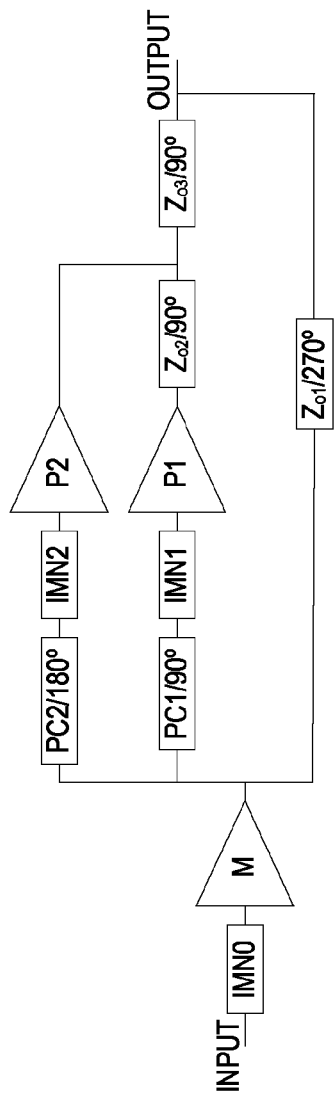

With the direct power dividing technique, the series-type DPA and the parallel-type DPA can be combined. FIG. 14 shows an alternative embodiment of 3-way DPA. In the embodiment shown in FIG. 14, the input of the first peak amplifier (P1) is connected to the output of the main amplifier (M), and the input of the second peak amplifier (P2) is connected to the output of the main amplifier (M). The first impedance converter $Z_{o1}$ has a phase shift of 270°, and each of the second impedance converter $Z_{o2}$ and the third impedance converter $Z_{o3}$ has a phase shift of 90°. Additionally, the first phase compensator PC0 is not shown (i.e., having a phase shift of 0°), the second phase compensator PC1 has a phase shift of 90° and the third phase compensator PC2 has a phase shift of 180°. A signal input from the amplifier input has the same phase (270°) at the amplifier output after passing through any of branches in the 3-way DPA. According to the operation principle of the 3-way DPA, as the input signal power increases, the first peak amplifier will be turned on earlier than the second peak amplifier. Thus, with different designs of IMN1 and IMN2, a portion of the output signal of the main amplifier is coupled to the input of the first peak amplifier first, such that the first peak amplifier will be turned on for power combination with the main amplifier at the output of the DPA. Then, as the signal power increases, with the impedance conversion effects of IMN1 and IMN2, a portion of the output signal of the main amplifier will be coupled to the input of the second peak amplifier (in addition to being coupled to provide a desired input power for the first peak amplifier), so as to drive the second peak amplifier for power combination with the main amplifier and the first peak amplifier at the output of the DPA, thereby allowing the 3-way DPA to be functional.

Figure 15:
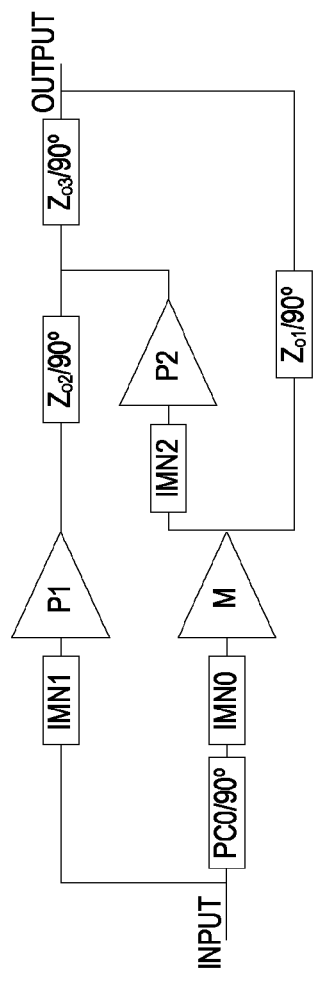

FIG. 15 shows another alternative embodiment of 3-way DPA. In the embodiment shown in FIG. 15, the input of the first peak amplifier (P1) is connected to the amplifier input, and the input of the second peak amplifier (P2) is connected to the output of the main amplifier (M). Each of the first impedance converter $Z_{o1}$, the second impedance converter $Z_{o2}$, and the third impedance converter $Z_{o3}$ has a phase shift of 90°. Additionally, the first phase compensator PC0 has a phase shift of 90°, and the second phase compensator PC1 and the third phase compensator PC2 are not shown (i.e., each having a phase shift of 0°). A signal input from the amplifier input has the same phase (180°) at the amplifier output after passing through any of branches in the 3-way DPA. Since in this case the main amplifier and the first peak amplifier are connected in parallel at their inputs, the design of the input impedance matcher IMN1 for the first peak amplifier is such that its non-linear input impedance can be converted from the input of the first peak amplifier to a signal source input, so as to achieve adaptive direct power dividing. The design of the input impedance matcher IMN2 for the second peak amplifier is such that its non-linear input impedance can be converted from the input of the second peak amplifier to the output of the main amplifier, so as to achieve adaptive direct power dividing. Further, compared with the parallel-connected Type II DPA and Type III DPA in the prior art, the DPA configuration in FIG. 15 incorporates only four λ/4 (90° transmission lines for input phase compensation and output impedance modulation. Since the λ/4 (90°) transmission lines generally have large sizes, the DPA configuration in FIG. 15 is especially advantages for miniaturizing circuits and lowering costs.

Figure 16:
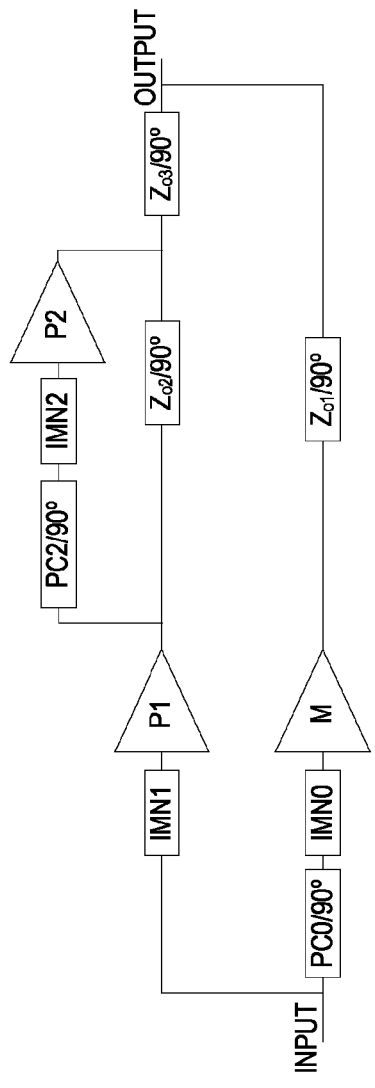

FIG. 16 shows another alternative embodiment of 3-way DPA. In the embodiment shown in FIG. 16, the input of the first peak amplifier (P1) is connected to the amplifier input, and the input of the second peak amplifier (P2) is connected to the output of the first peak amplifier (P1). Each of the first impedance converter $Z_{o1}$, the second impedance converter $Z_{o2}$, and the third impedance converter $Z_{o3}$ has a phase shift of 90°. Additionally, each of the first phase compensator PC0 and the third phase compensator PC2 has a phase shift of 90°, and the second phase compensator PC1 is not shown (i.e., each having a phase shift of 0°). A signal input from the amplifier input has the same phase (180°) at the amplifier output after passing through any of branches in the 3-way DPA. Since in this case the main amplifier and the first peak amplifier are connected in parallel at their inputs, the design of the input impedance matcher IMN1 for the first peak amplifier is such that its non-linear input impedance can be converted from the input of the first peak amplifier to a signal source input, so as to achieve adaptive direct power dividing. The design of the input impedance matcher IMN2 for the second peak amplifier is such that its non-linear input impedance can be converted from the input of the second peak amplifier to the output of the first peak amplifier, so as to achieve adaptive direct power dividing.

Figure 17:
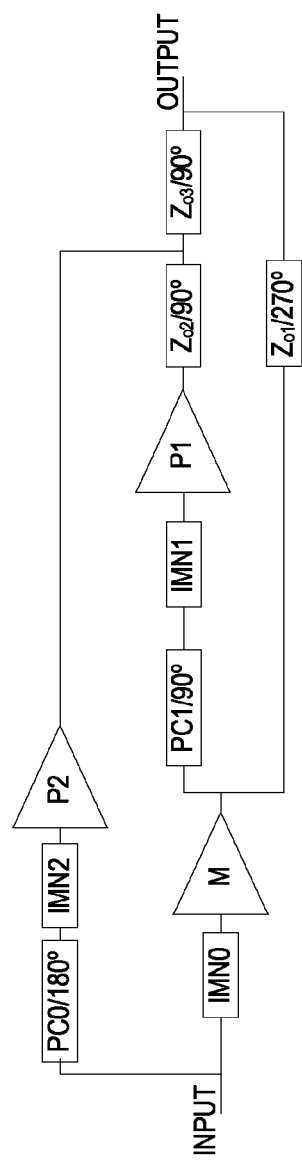

FIG. 17 shows another alternative embodiment of 3-way DPA. In the embodiment shown in FIG. 17, the input of the first peak amplifier (P1) is connected to the output of the main amplifier (M), and the input of the second peak amplifier (P2) is connected to the amplifier input. The first impedance converter $Z_{o1}$ has a phase shift of 270°, and each of the second impedance converter $Z_{o2}$ and the third impedance converter $Z_{o3}$ has a phase shift of 90°. Additionally, the first phase compensator PC0 is not shown (i.e., having a phase shift of 0°), the second phase compensator PC1 has a phase shift of 90° and the third phase compensator PC2 has a phase shift of 180°. A signal input from the amplifier input has the same phase (270°) at the amplifier output after passing through any of branches in the 3-way DPA. Since in this case the main amplifier and the second peak amplifier are connected in parallel at their inputs, the design of the input impedance matcher IMN2 for the second peak amplifier is such that its non-linear input impedance can be converted from the input of the second peak amplifier to a signal source input, so as to achieve adaptive direct power dividing. The design of the input impedance matcher IMN1 for the first peak amplifier is such that its non-linear input impedance can be converted from the input of the first peak amplifier to the output of the main amplifier, so as to achieve adaptive direct power dividing.

The basic principle of the direct power dividing is the same for the above alternative 3-way DPA configurations. It is possible to achieve the adaptive power distribution at the input or output of the main amplifier and/or the peak amplifier.

Additionally, it is possible to use lumped elements (inductors and capacitors) for phase compensation and impedance matching/conversion [3], [11], so as to implement the DPA structures according to the present disclosure.

Figure 18A:
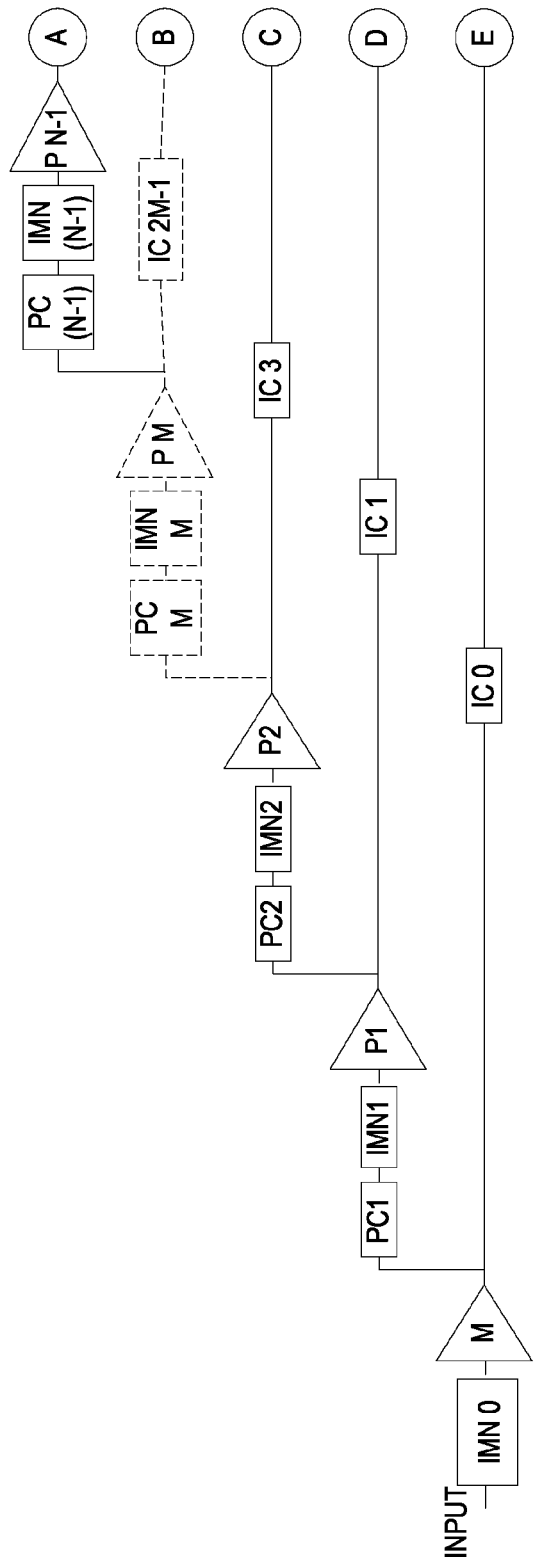
FIGS. 18A and B are schematic diagrams of a multi-way ((N+1)-way) DPA according to an embodiment of the present disclosure.
Figure 18B:
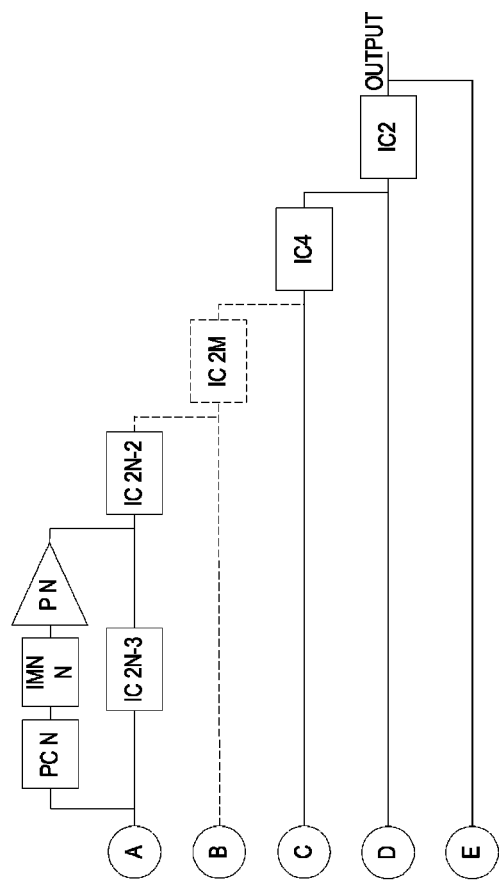

Next, the embodiments of multi-way (more than 3-way) DPAs according to the present disclosure will be described. FIG. 18 is a schematic diagram of a multi-way DPA according to an embodiment of the present disclosure. The multi-way Doherty amplifier as shown in FIG. 18 may include: an amplifier input; an amplifier output; a main amplifier having an input connected to the amplifier input; 1st to N-th peak amplifiers where N is an integer larger than 2, wherein an input of the 1st peak amplifier is connected to the amplifier input or an output of the main amplifier, for an integer 2≤n≤N, an input of the n-th peak amplifier is connected to the amplifier input, the output of the main amplifier or an output of one of the 1st to the (n−1)-th peak amplifiers; and 1st to (2N−1)-th impedance converters (ICs), wherein the 1st impedance converter is connected between the output of the main amplifier and the amplifier output, the 2nd impedance converter has one end connected to the output of the 1st peak amplifier and the other end connected to one end of the 3rd impedance converter, the other end of the 3rd impedance converter is connected to the amplifier output; for an integer 2≤m≤N−1, one end of the 2m-th impedance converter is connected to an output of the m-th peak amplifier, the other end of the 2m-th impedance converter is connected to one end of the (2m+1)-th impedance converter, and the other end of the (2m+1)-th impedance converter is connected to a point at which the (2m−2)-th impedance converter is connected to the (2m−1)-th impedance converter; and wherein an output of the N-th peak amplifier is connected to a point at which the (2N−2)-th impedance converter is connected to the (2N−1)-th impedance converter.

Figure 19:
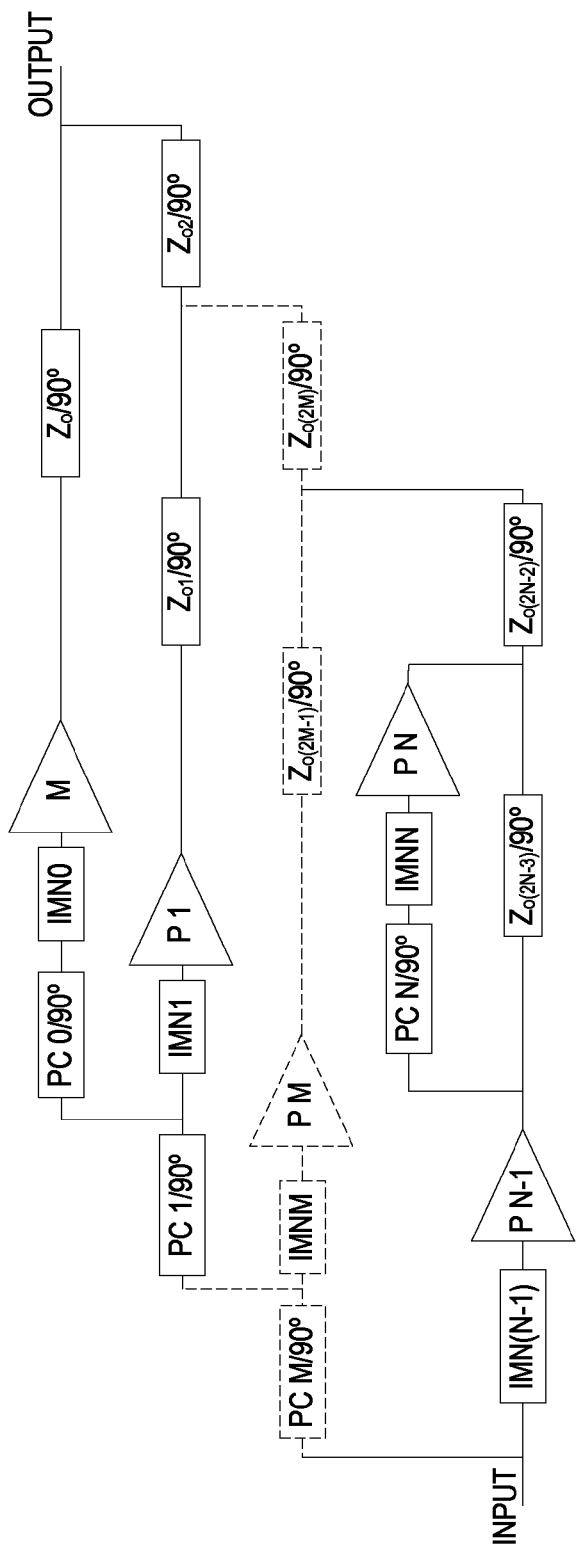
FIG. 19 is a schematic diagram of a multi-way ((N+1)-way) DPA according to another embodiment of the present disclosure.

FIG. 19 is a schematic diagram of a multi-way DPA according to another embodiment of the present disclosure. The output network portion (i.e., the configuration of impedance converters) of the embodiment shown in FIG. 19 is the same as that of the embodiment shown in FIG. 18. In FIG. 19, the inputs of the 1st to the N-th peak amplifiers are connected to the amplifier input.

As shown in FIGS. 18 and 19, in the multi-way DPA according to the present disclosure, each of the 1st to (2N−1)-th impedance converters is a transmission line of an odd multiple of ¼ wavelength (λ/4) and has a phase shift of an odd multiple of 90°.

According to an embodiment, the multi-way DPA according to the present disclosure may further include: 1st to (N+1)-th impedance matcher (IMN0-IMN N), wherein the input of the main amplifier is connected to the amplifier input via the 1st impedance matcher IMN0. As an example, in the DPA structure shown in FIG. 18, the input of the first peak amplifier is connected to the output of the main amplifier via the 2nd impedance matcher IMN1. For an integer 2≤n≤N, the input of the n-th peak amplifier is connected to the output of the (n−1)-th peak amplifiers via the (n+1)-th impedance matcher. As an alternative, in the DPA structure shown in FIG. 19, the inputs of the 1st to the (N−1)-th peak amplifiers are connected to the amplifier input via the 2nd to the N-th impedance matchers, IMN1-IMN N−1, respectively, and the input of the N-th peak amplifier is connected to the output of the (N−1)-th peak amplifier via the (N+1)-th impedance matcher IMN N. In other embodiments of the present disclosure, for an integer 2≤n≤N, the input of the n-th peak amplifier is connected to the amplifier input, the output of the main amplifier or the output of one of the 1st to the (n−1)-th peak amplifiers via the (n+1)-th impedance matcher.

According to an embodiment, the impedances of the 1st to (N+1)-th impedance matchers can be designed based on non-linear characteristics of the main amplifier and the 1st to N-th peak amplifiers. In particular, the design of the input impedance converter for each amplifier depends on a combination of the non-linear input characteristics of the amplifier, the operation states of the amplifiers at the same stage and their input signal characteristics as well as the operation states of the amplifiers at the previous stage and their input signal characteristics. As noted above, it can be appreciated that the multi-way DPA according to the present disclosure is not limited to any specific design of the input impedance converters.

According to an embodiment, the multi-way DPA according to the present disclosure may further include: 1st to (N+1)-th phase compensator PC0-PCN, wherein the input of the main amplifier is connected to the amplifier input via the 1st phase compensator. As an example, in the DPA structure shown in FIG. 18, the input of the 1st peak amplifier is connected to the output of the main amplifier via the 2nd phase compensator PC1. For an integer 2≤n≤N, the input of the n-th peak amplifier is connected to the output of the (n−1)-th peak amplifier via the (n+1)-th phase compensator. As an alternative, in the DPA structure shown in FIG. 19, inputs of the 1st to the (N−1)-th peak amplifiers are connected to the amplifier input via the 2nd to the N-th phase compensators, PC1-PC N−1, respectively, and the input of the N-th amplifier is connected to the output of the (N−1)-th peak amplifier via the (N+1)-th phase compensator. In other embodiments of the present disclosure, for an integer 2≤n≤N, the input of the n-th peak amplifier is connected to the amplifier input, the output of the main amplifier or the output of one of the 1st to the (n−1)-th peak amplifiers via the (n+1)-th phase compensator. According to an embodiment of the present disclosure, the phase shifts of the 1st to (N+1)-th phase compensators can be designed to compensate phase shifts of the 1st to (2N−1)-th impedance converters such that a signal input from the amplifier input has the same phase at the amplifier output after passing through any of branches in the multi-way Doherty amplifier.

Figure 20:
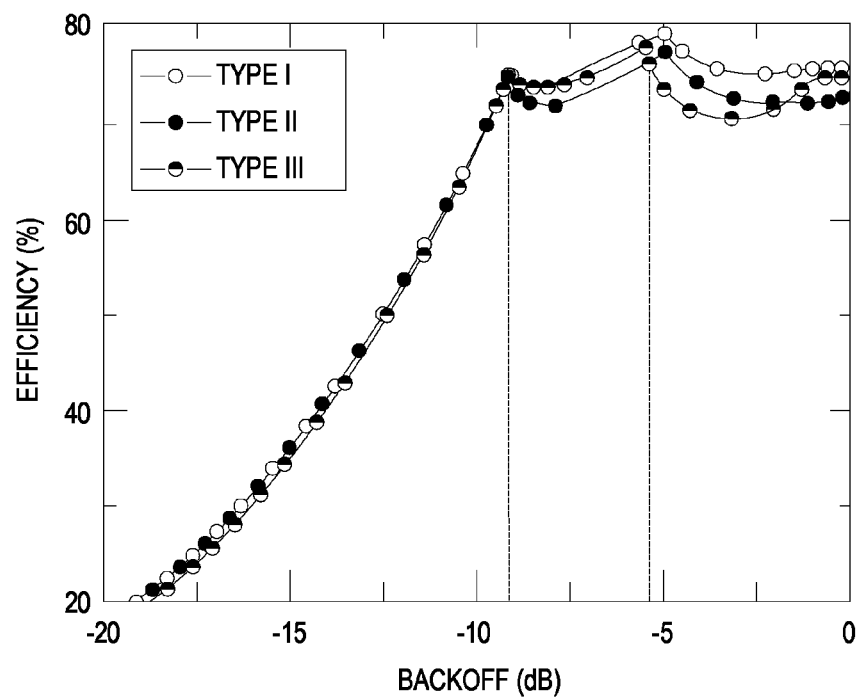
FIG. 20 shows simulation results of Continuous Wave (CW) signal power scan for the 3-way DPAs as shown in FIGS. 13-15.
Figure 21:
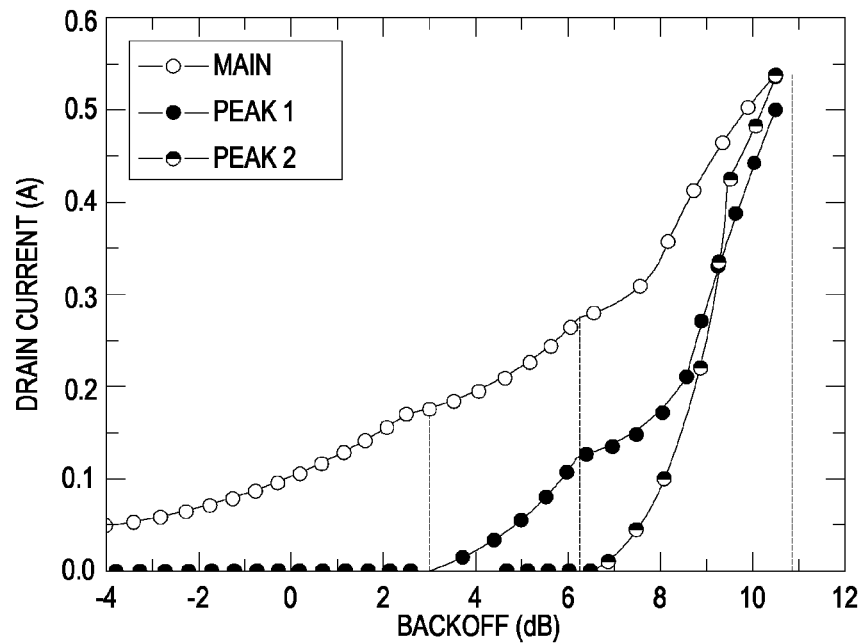
FIGS. 21 and 22 show simulation results of drain current and voltage amplitudes for the 3-way DPA as shown in FIG. 13.
Figure 22:
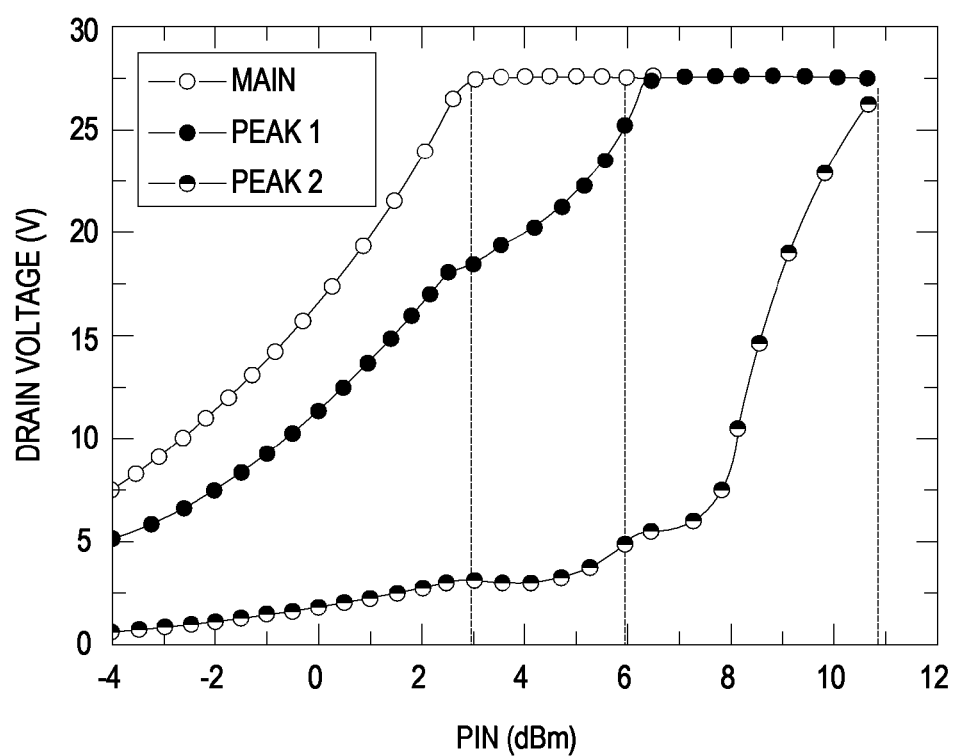

The above various implementations of the 3-way DPA structures according to the present disclosure are simulated and verified using Continuous Wave (CW) signals. The nonlinear models of the three amplifiers (transistors) use the same simplified equivalent circuit empirical model as that shown in FIG. 11A. FIG. 20 shows simulation results of CW signal power scan for the 3-way DPAs as shown in FIGS. 13-15. It can be seen from FIG. 20 that there are three maximum efficiency points in the power back-off region and the operation characteristics of the above 3-way DPA without any input power splitter are thus verified. FIGS. 21 and 22 show simulation results of drain current and voltage amplitudes for the 3-way DPA as shown in FIG. 13. It can be seen from FIGS. 21 and 22 that the first peak amplifier and the second peak amplifier are sequentially turned on and become saturated at the maximum output power of the DPA along with the main amplifier at the same time. Further, the output load impedance of the main amplifier can be modulated over the full dynamic range. Thus, the above 3-way DPA has the advantage of flat power gain characteristics.

The present disclosure has been described above with reference to the preferred embodiments thereof. It should be understood that various modifications, alternations and additions can be made by those skilled in the art without departing from the spirits and scope of the present disclosure. Therefore, the scope of the present disclosure is not limited to the above particular embodiments but only defined by the claims as attached.

REFERENCES

[1] W. H. Doherty, "A new high efficiency power amplifier for modulated waves," Proc. IRE., September 1936.
[2] Jung et al., A new "series-type" Doherty amplifier for miniaturization", 2005 IEEE IMS.
[3] Kim et al., "Series-type Doherty amplifier without hybrid coupler", U.S. Pat. No. 7,164,316, January, 2007.
[4] Koo et al., "A Linearity-Enhanced Compact Series-Type Doherty Amplifier Suitable for CDMA Handset Applications", IEEE, 2007.
[5] Kang et al., "Broadband HBT Doherty Power Amplifiers for Handset Applications", IEEE Transactions on MTT, September 2010.
[6] Kang et al., "Design of Doherty Power Amplifiers for Handset Applications", IEEE Transactions on MTT, August 2010.
[7] Nick et al., "Adaptive Input-Power Distribution in Doherty Power Amplifiers for Linearity and Efficiency Enhancement", IEEE Transactions on MTT, November 2010.
[8] Kim et al., "Optimum operation of asymmetrical-cells-based linear Doherty power amplifiers-uneven power drive and power matching", IEEE Transactions on MTT, May 2005.
[9] Kim et al., "Optimized Design of a Highly Efficient Three-Stage Doherty Pa. Using Gate Adaptation", IEEE Transactions on MTT, October 2010.
[10] Kim et al., "Advanced Doherty Architecture", IEEE microwave magazine, August 2010.
[11] Gajadharsing et al., "3-way Doherty amplifier with minimum output network", International patent, PCT number: WO2009/081341, July, 2009.
[12] Kim et al., "Doherty amplifier", U.S. Pat. No. 6,853,245, February, 2005.
[13] Srirattana et al., "Analysis and design of a high-efficiency multistage Doherty power amplifier for wireless communications", IEEE Transactions on MTT, March 2005.
[14] Liu et al., "Electrothermal Large-Signal Model of III-V FETs Including Frequency Dispersion and Charge Conservation", IEEE Transactions on MTT, December 2009.
[15] Angelov et al., "Extensions of the Chalmers nonlinear HEMT and MESFET model," IEEE Transactions on MTT, October 1996.
[16] Fager et al., "Prediction of IMD in LDMOS transistor amplifiers using a new large-signal model," IEEE Transactions on MTT, December 2002.
[17] Yang et al., "A microwave Doherty amplifier employing envelope tracking technique for high efficiency and linearity", IEEE MWCL, September 2003.

The invention claimed is:

1. A multi-way Doherty amplifier, comprising:
an amplifier input;
an amplifier output;
a main amplifier having an input connected to the amplifier input;
at least a first peak amplifier and a second peak amplifier, wherein an input of the first peak amplifier is connected to the amplifier input, and an input of the second peak amplifier is connected to the output of the main amplifier;
a first impedance converter connected between the output of the main amplifier and the amplifier output;
a second impedance converter connected between the output of the first peak amplifier and an output of the second peak amplifier; and
a third impedance converter connected between the output of the second peak amplifier and the amplifier output.

2. The multi-way Doherty amplifier according to claim 1, wherein each of the first, second and third impedance converters is a transmission line of an odd multiple of ¼ wavelength and has a phase shift of an odd multiple of 90°.

3. The multi-way Doherty amplifier according to claim 1, further comprising:
a first impedance matcher via which the input of the main amplifier is connected to the amplifier input;
a second impedance matcher via which the input of the first peak amplifier is connected to the amplifier input or the output of the main amplifier; and a third impedance matcher via which the input of the second peak amplifier is connected to the amplifier input, the output of the main amplifier or the output of the first peak amplifier.

4. The multi-way Doherty amplifier according to claim 3, wherein impedances of the first, second and third impedance matchers are designed based on non-linear characteristics of the main amplifier, the first peak amplifier and the second peak amplifier.

5. The multi-way Doherty amplifier according to claim 1, further comprising:
   a first phase compensator via which the input of the main amplifier is connected to the amplifier input;
   a second phase compensator via which the input of the first peak amplifier is connected to the amplifier input or the output of the main amplifier; and
   a third phase compensator via which the input of the second peak amplifier is connected to the amplifier input, the output of the main amplifier or the output of the first peak amplifier;
   wherein phase shifts of the first, second and third phase compensators are designed to compensate phase shifts of the first, second and third impedance converters such that a signal input from the amplifier input has the same phase at the amplifier output after passing through any of branches in the multi-way Doherty amplifier.

6. A wireless communication device comprising a multi-way Doherty amplifier, said multi-way Doherty amplifier comprising:
   an amplifier input;
   an amplifier output;
   a main amplifier having an input connected to the amplifier input;
   at least a first peak amplifier and a second peak amplifier, wherein an input of the first peak amplifier is connected to the amplifier input, and an input of the second peak amplifier is connected to the output of the main amplifier;
   a first impedance converter connected between the output of the main amplifier and the amplifier output;
   a second impedance converter connected between the output of the first peak amplifier and an output of the second peak amplifier; and
   a third impedance converter connected between the output of the second peak amplifier and the amplifier output.

7. The wireless communication device of claim 6, wherein the wireless communication device is a user equipment.

8. The wireless communication device of claim 6, wherein the wireless communication device is a base station.

* * * * *